United States Patent [19]

Hayakawa et al.

[11] Patent Number: 4,637,029
[45] Date of Patent: Jan. 13, 1987

[54] SEMICONDUCTOR LASER

[75] Inventors: Toshiro Hayakawa, Nara; Nobuyuki Miyauchi, Tenri; Seiki Yano, Kashihara; Takahiro Suyama, Tenri, all of Japan

[73] Assignee: Sharp Kabushiki Kaisha, Osaka, Japan

[21] Appl. No.: 633,990

[22] Filed: Jul. 24, 1984

[30] Foreign Application Priority Data

Jul. 29, 1983 [JP] Japan .................................. 58-140756

[51] Int. Cl.$^4$ .............................................. H01S 3/19
[52] U.S. Cl. .................................... 372/45; 357/16; 357/17; 372/48
[58] Field of Search ................ 372/44, 45, 48, 36; 357/17, 16

[56] References Cited

U.S. PATENT DOCUMENTS 4,592,060 5/1986 Hayakawa et al. ................ 372/44
4,592,062 5/1986 Yamamoto et al. ................ 372/48

OTHER PUBLICATIONS

S. Yamamoto et al, "680 nm CW Operation at Room Temperature by AlGaAs Double Heterojunction Lasers", IEEE Journal of Quantum Electronics, vol. QE-19, No. 6, Jun. 1983, pp. 1009-1015.

Primary Examiner—James W. Davie
Attorney, Agent, or Firm—Birch, Stewart, Kolasch and Birch

[57] ABSTRACT

A GaAlAs semiconductor laser element includes a $Ga_{1-x}Al_xAs$ active layer sandwiched by a first and second $Ga_{1-y}Al_yAs$ cladding layers. A $Ga_{1-z}Al_zAs$ substrate layer supports the first cladding layer, and a $Ga_{1-z}Al_zAs$ cap layer covers the second cladding layer. The AlAs mole fraction (z) of the substrate layer and the cap layer is selected slightly smaller than the AlAs mole fraction (x) of the active layer. Further, the active layer is located in the laser element so that the active layer is separated from the mounted surface by more than 35% of the laser element thickness, and is separated from the opposing surface by more than 18% of the laser element thickness.

7 Claims, 14 Drawing Figures

SEMICONDUCTOR LASER

BACKGROUND AND SUMMARY OF THE INVENTION

The present invention relates to a semiconductor laser and, more particularly, to a laser device construction which minimizes the stress applied to an active layer, thereby ensuring stable operation.

A GaAlAs semiconductor laser having the lasing wavelength in 0.8 μm range has been developed, which enjoys an operating period above $10^6$ hours at room temperature. The operating life period is greatly lengthened by minimizing occurrence of a dark line or a dark spot, or by minimizing mirror erosion. The occurrence of the dark line or the dark spot is minimized by reducing the defect density in the grown crystal, which is achieved by the improvement of the crystal growth techniques or the reduction of oxygen in the growth system. The mirror erosion is minimized if the mirror surface is coated by a dielectric film made of, for example, $Al_2O_3$, $SiO_2$ or $Si_3N_4$.

The above-mentioned semiconductor laser shows stable operation if the semiconductor laser operates as an infrared laser which has the lasing wavelength longer than 0.8 μm. However, the semiconductor laser does not show stable operation nor the long operating period if the semiconductor laser operates as a visible laser which has the lasing wavelength shorter than 0.8 μm.

To enhance the reliability of the GaAlAs semiconductor visible laser, improvements have been proposed in, for example, Japanese Patent Application Nos. 55-166124 and 56-44775, assigned to the same assignee as the present application, wherein the Te-doped or Se-doped cladding layer is formed through the use of the epitaxial method after the active layer has been formed, whereby the crystal construction of the active layer is greatly enhanced. The thus formed GaAlAs semiconductor laser exhibits the long operating period at the lasing wavelength around 0.77 μm. However, the operating period becomes suddenly short as the lasing wavelength becomes shorter than 0.77 μm.

Generally, in the GaAlAs double-heterostructure laser, the lattice constant of the GaAs substrate is similar to the lattice constant of the respective grown layers at the growth temperature, about 800° C. However, the lattice constant of the respective layers and the lattice constant of the GaAs substrate differ from each other at room temperature, because the coefficient of the thermal expansion of $Ga_{1-x}Al_xAs$ varies as the Al mole fraction x varies. The above-mentioned difference of the lattice constant creates a large stress applied to the active layer at room temperature. The thus created stress may shorten the operating life period of the semiconductor laser. To minimize the stress caused by the mounted condition, a construction has been proposed in U.S. Patent Application Ser. No. 482,246, "SEMICONDUCTOR LASER" filed on Apr. 5, 1983, by Toshiro HAYAKAWA, Nobuyuki MIYAUCHI and Seiki YANO, and assigned to the same assignee as the present application (European Patent Application No. 83302006.8), wherein the active layer is separated from the mounted surface by at least a distance which corresponds to 35% of a thickness of the semiconductor laser element, and is separated from the opposing element surface by at least a distance which corresponds to 18% of the element thickness. However, sufficiently stable operation is not ensured by only controlling the location of the active layer.

Accordingly, an object of the present invention is to provide a semiconductor laser which stably emits the laser beam in the visible spectral range.

Another object of the present invention is to provide a semiconductor laser device structure, wherein the stress applied to the active layer is minimized.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, the active layer is formed at a position separated from the mounted surface by a distance greater than 35% of the device thickness. Further, the active opposite to the mounted surface by a distance greater than 18% of the device thickness so as to minimize the stress applied to the active layer caused by the mounted condition. In order to minimize the strain caused by the difference of the coefficient of the thermal expansion of the respective layers, buffer layers having a thermal expansion similar to the cladding layers, which sandwich the active layer, are formed to contact the cladding layers.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
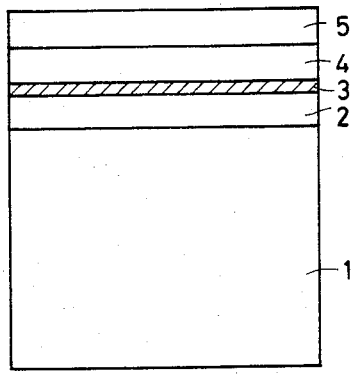
FIG. 1 is a schematic sectional view showing a basic construction of a double-heterostructure semiconductor laser element.

FIG. 1 schematically shows a general construction of a double-heterostructure semiconductor laser, which includes a GaAs substrate 1, a $Ga_{1-y}Al_yAs$ cladding layer 2, a $Ga_{1-x}Al_xAs$ active layer 3, a $Ga_{1-y}Al_yAs$ cladding layer 4, and a GaAs cap layer 5. That is, the semiconductor laser generally has the multilayered crystal construction. If the GaAs substrate 1 has 100 μm thickness, the active layer 3 has 0.1 μm thickness, and the cladding layers 2 and 4 and the cap layer 5 have 1 μm thickness, respectively, the stress applied to the active layer 3 can be calculated as follows when a temperature is reduced from 800° C. to 20° C.

Figure 2:
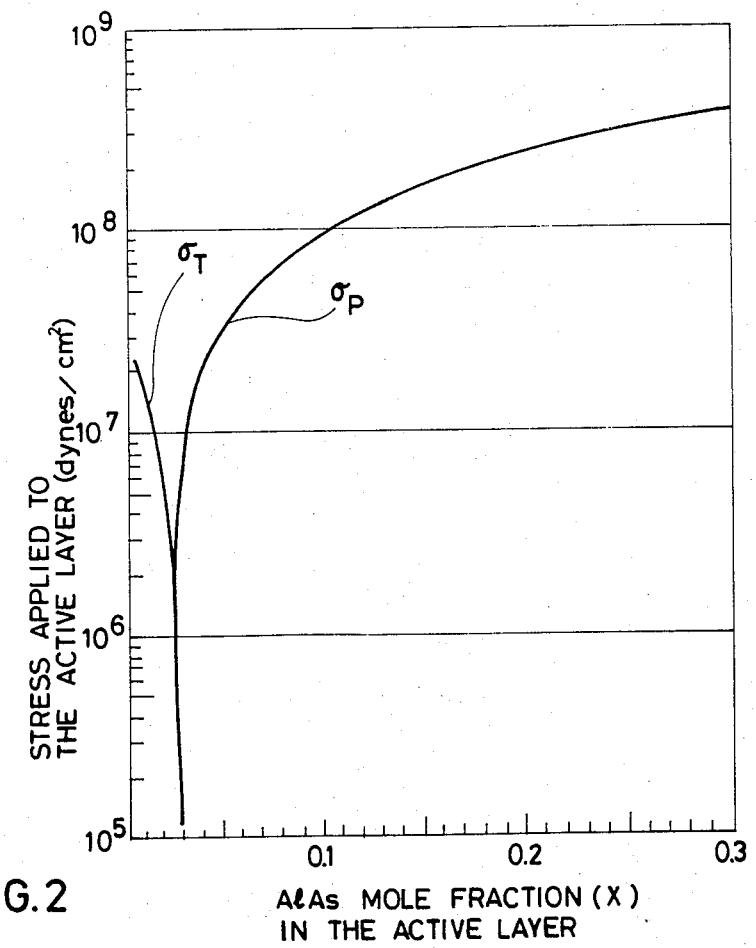
FIG. 2 is a graph showing the variation of the stress applied to an active layer of the semiconductor laser element of FIG. 1 when the AlAs mole fraction of the active layer changes.

FIG. 2 shows the stress applied to the active layer 3, which is obtained from the calculation, when the AlAs mole fraction "x" of the active layer 3 is varied while the AlAs mole fraction difference $\Delta x$ ($=y-x$) between the active layer 3 and the cladding layers 2 and 4 is fixed to 0.3. Between $x=0$ and $x=0.02$, the tensile stress $\sigma_T$ is applied to the active layer 3, and the tensile stress $\sigma_T$ reduces as the AlAs mole fraction "x" increases. Above $x=0.02$, the compressive stress $\sigma_P$ is applied to the active layer 3, and the compressive stress $\sigma_P$ increases as the AlAs mole fraction "x" increases. The semiconductor laser of FIG. 1 exhibits the lasing wavelength 0.74 μm when the AlAs mole fraction "x"$=0.2$, at which the compressive stress over $2 \times 10^8$ dynes/cm$^2$ is applied to the active layer 3. The thus applied stress will deteriorate the GaAlAs visible semiconductor laser as reported in IEEE, Journal of Quantum Electronics, Vol. QE - 17, No. 5, pp. 763 (1981).

Figure 3:
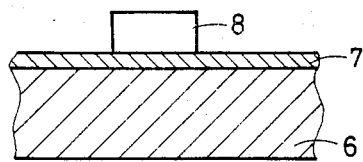
FIG. 3 is a schematic sectional view showing a condition when a semiconductor laser element is mounted on a stem.

The above-mentioned calculation is not applicable to the actual device, bacause the semiconductor laser is normally mounted on a Cu heat sink with In solder as shown in FIG. 3.

That is, a laser element 8 is mounted on a heat sink 6 through the use of a solder 7. The coefficients of thermal expansion of the laser element 8, the heat sink 6 and the solder 7 are different from each other and, therefore, a large stress is applied to the laser element 8 when the device is cooled from the mounting temperature to room temperature.

If a Cu heat sink of 1 mm thick is employed, a compressive external force of about $10^7$ dynes/cm is applied to the laser element 8 when the temperature reduces by about 150° C., due to the difference of the Cu coefficient of thermal expansion ($1.7 \times 10^{-5}$) and the GaAs coefficient of themal expansion ($6.9 \times 10^{-6}$). When an In solder is interposed between the laser element and the Cu heat sink, the compressive force applied to the laser element is reduced toward $10^6$ dynes/cm due to the plastic deformation formed in the In solder.

When the stress applied to the laser element, which is mounted on the Cu heat sink with the In solder, is measured through the use of the photo-elastic measurement technique, it is observed that the stress becomes small as the distance from the mounted surface increases. Furthermore, the stress becomes large as the distance from the surface opposite to the mounted surface becomes small. That is, the compressive stress is applied from the heat sink to the laser element at the mounted surface, and the tensile stress is applied to the surface opposite to the mounted surface due to the deformation created in the laser element. The stress caused by the mounted condition is greater than the stress caused by the laser element itself.

A laser construction has been proposed in copending application Ser. No. 482,246, now U.S. Pat. No. 4,592,060, "SEMICONDUCTOR LASER" filed on Apr. 5, 1983 by Toshiro HAYAKAWA, Nobuyuki MIYAUCHI and Seiki YANO, and assigned to the same assignee as the present application, wherein the active layer is located in a device at a position where the stress caused by the mounted condition is minimized. More specifically, in now U.S. Pat. Ser. N. No. 4,592,060, a laser device is proposed, wherein the active layer is separated from the mounted surface by at least a distance which corresponds to 35% of a thickness of the laser element, and is separated from the opposing surface by at least 18% of the element thickness.

The present invention is to further minimize the stress applied to the active layer by providing a substrate and a cap layer having a coefficient of the thermal expansion similar to the cladding layers, thereby ensuring the stable operation at the lasing wavelength below 0.77 μm.

The stress applied to the active layer will be calculated as follows. The following calculation is conducted through the use of a semiconductor laser shown in FIG. 4.

Figure 4:
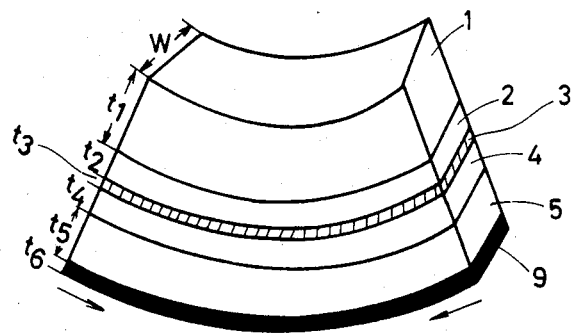
FIG. 4 is a schematic view showing a semiconductor laser wafer for explaining a calculated stress.

The semiconductor laser element of FIG. 1 is mounted on a base layer 9 functioning as the heat sink and the solder. In the example of FIG. 4, the semiconductor laser element is mounted on the base layer 9 in a fashion that the cap layer 5 contacts the base layer 9. However, a similar calculation result is obtained even when the semiconductor laser element is mounted on the base layer 9 in a fashion that the substrate 1 contacts the base layer 9. The calculation is based on the assumption that the strain in the semiconductor laser element is caused by the difference of the coefficients of the thermal expansion of the respective layers when the temperature is reduced from the growth temperature 800° C. to room temperature 20° C., namely, by 780° C. Further, the shrinkage of the base layer 9 is changed to vary the external force applied to the semiconductor laser element.

Figure 5:
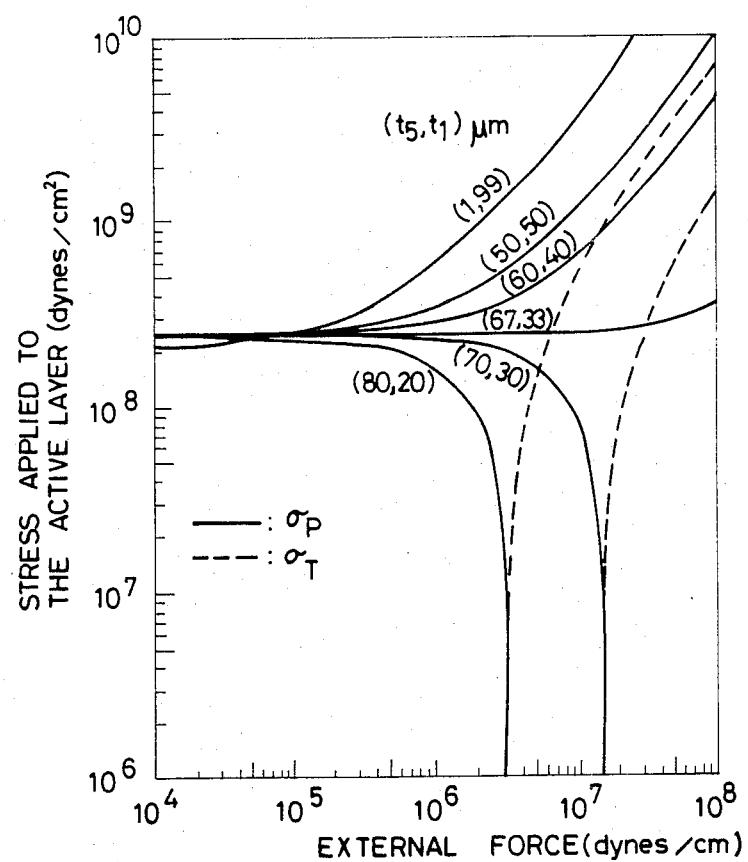
FIG. 5 is a graph showing the variation of the stress applied to the active layer of the semiconductor laser element of FIG. 1 when the external force and thickness ratio ($t_5$, $t_1$) of the cap layer and the substrate change.

FIG. 5 shows the calculation result when the semiconductor laser element has the GaAs substrate 1 and the GaAs cap layer 5, and exhibits the lasing wavelength of about 750 nm. More specifically, FIG. 5 shows the stress applied to the active layer 3, depending on the external force, when the AlAs mole fraction of the substrate 1 and the cap layer 5 is "0", the AlAs mole fraction (y) of the cladding layers 2 and 4 is "0.5", and the AlAs mole fraction (x) of the active layer 3 is "0.2". The $Ga_{0.5}Al_{0.5}As$ cladding layer 2 has the thickness of 1 μm, the $Ga_{0.8}Al_{0.2}As$ active layer 3 has the thickness of 0.1 μm, and the $Ga_{0.5}Al_{0.5}As$ cladding layer 4 has the thickness of 1 μm. Further, the thickness of the GaAs substrate 1 is varied while the total thickness of the GaAs substrate 1 and the GaAs cap layer 5 is mainted at 100 μm. It will be clear from FIG. 5 that the external force does not affect the active layer 3 if the thickness ratio of the cap layer 5 and the substrate 1 is selected at 67:33. That is, as discussed in copending application Ser. No. 482,246, in case the external force is not very strong, the stress applied to the active layer 3 is considerably reduced when the active layer 3 is separated from the mounted surface by at least 35% of the laser element thickness, and is separated from the opposing surface by at least 18% of the laser element thickness.

Figure 6:
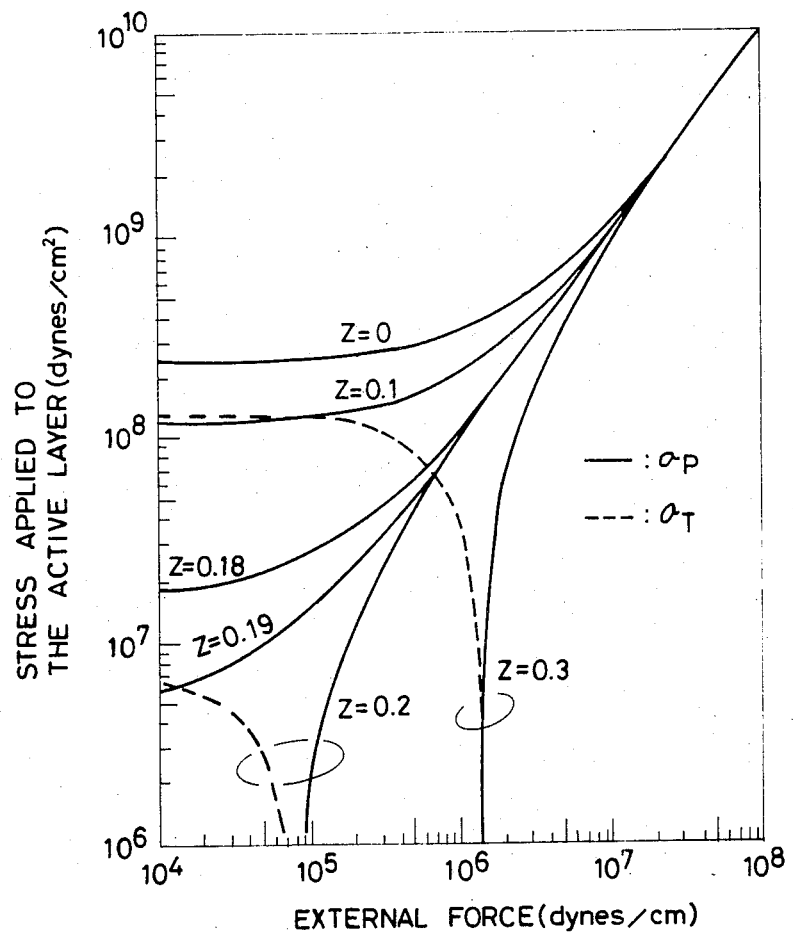
FIG. 6 is a graph showing the variation of the stress applied to the active layer of the semiconductor laser element of FIG. 1 when the external force and the AlAs mole fraction of the substrate and the cap layer change.

The present invention is to further reduce the stress applied to the active layer 3 by employing a GaAlAs substrate and a GaAlAs cap layer so as to minimize the difference of the coefficients of the thermal expansion between the double-heterostructure layers and the substrate or the cap layer. FIG. 6 shows the calculation result of the stress applied to the $Ga_{0.8}Al_{0.2}As$ active layer 3 of FIG. 4 when a $Ga_{1-z}Al_zAs$ substrate 1 and a $Ga_{1-z}Al_zAs$ cap layer 5 have the thickness of 50 μm, respectively. The remaining layers have the same constructions as those discussed with reference to FIG. 5. FIG. 6 shows the affect caused by the external force when the AlAs mole fraction (z) of the $Ga_{1-z}Al_zAs$ substrate 1 and the $Ga_{1-z}Al_zAs$ cap layer 5 is changed. It will be clear from FIG. 6 that the compressive stress applied to the active layer 3 reduces when the AlAs mole fraction (z) increases. Further, the tensile stress applied to the active layer 3 increases as the AlAs mole fraction (z) increases when the external force is considerably small.

The In solder disposed between the Cu heat sink and the semiconductor laser element functions to reduce the stress applied to the laser element because the melting point of In is relatively low, 155° C., and the In solder endures plastic deformation in addition to the elastic deformation when the device is cooled from the melting point to room temperature. When the In solder of several microns is disposed between the Cu heat sink of 1 mm thick and the laser element, the external force applied to the laser element is supposed to be $10^6$–$10^7$ dynes/cm. It will be clear from FIG. 6 that, when such an external force is applied to the laser element, the compressive stress applied to the active layer 3 is reduced when the AlAs mole fraction (z) is increased at least to 0.2. However, the tensile stress is applied to the active layer 3 when the AlAs mole fraction (z) is 0.2 and the external force is considerably small. When the AlAs mole fraction (z) is 0.3, the tensile stress is applied to the active layer 3 even when the external force is $10^6$ dynes/cm. The tensile stress will increase the defect density in the crystal and, therefore, the AlAs mole fraction (z) should not be selected so high.

Figure 7:
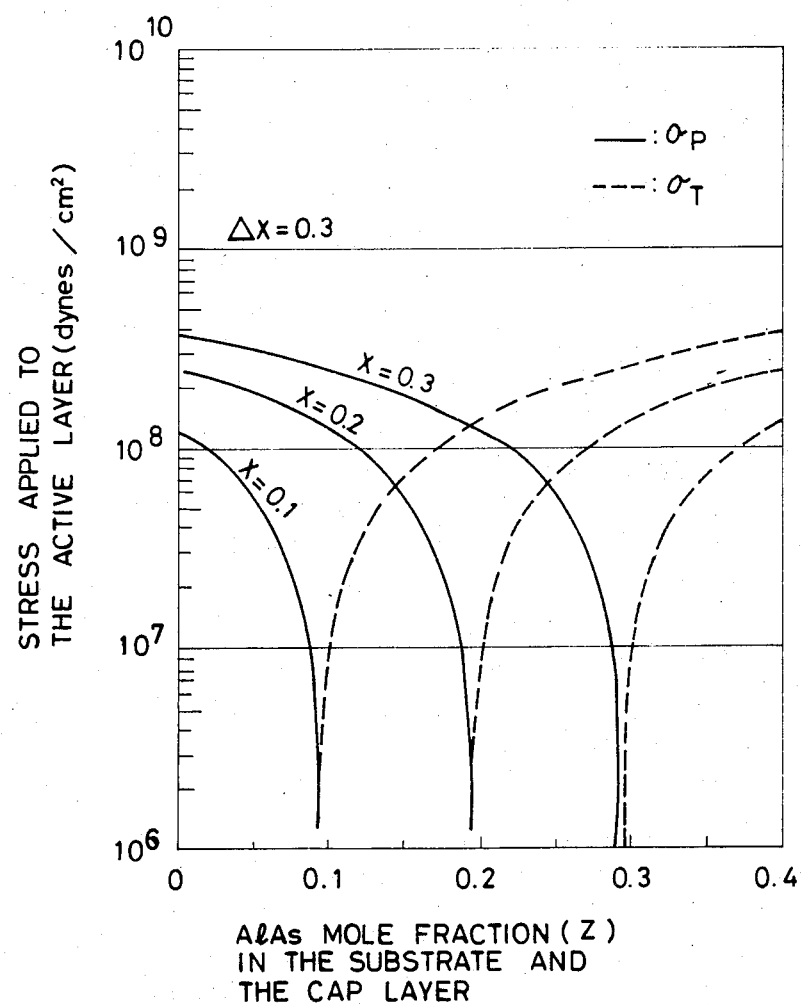
FIG. 7 is a graph showing the variation of the stress applied to the active layer of the semiconductor laser element of FIG. 1 when the AlAs mole fraction of the substrate and the cap layer changes while the difference ($\Delta x$) of the AlAs mole fraction of the cladding layer and the active layer is fixed at 0.3, and the external force is not applied to the element.

FIG. 7 shows the stress applied to the active layer 3 when no external force is applied to the laser element, and the AlAs mole fraction (z) of the substrate and the cap layer is changed. FIG. 7 is obtained by the calculation when the difference (Δx) between the AlAs mole fraction (y) of the cladding layer and the AlAs mole fraction (x) of the active layer is fixed to 0.3. FIG. 7 shows three cases having the AlAs mole fraction (x) of 0.1, 0.2 and 0.3. The semiconductor laser element has the substrate and the cap layer of 50 μm thick, respectively, the cladding layers of 1 μm thick, respectively, and the active layer of 0.1 μm. It will be clear from FIG. 7 that, when no external force is applied to the semiconductor laser element, the compressive stress applied to the active layer 3 reduces as the AlAs mole fraction (z) of the substrate and the cap layer increases toward the AlAs mole fraction (x) of the active layer. If the AlAs mole fraction (z) of the substrate and the cap layer exceeds the AlAs mole fraction (x) of the active layer, the tensile stress applied to the active layer 3 increases as the AlAs mole fraction (z) of the substrate and the cap layer increases.

Figure 8:
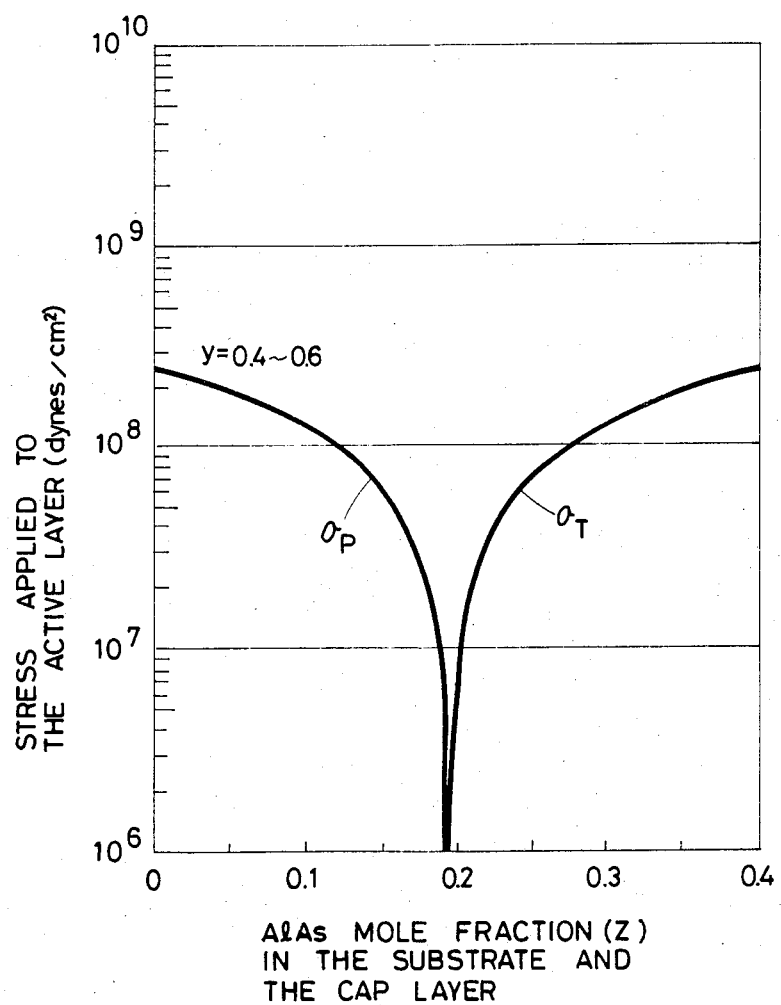
FIG. 8 is a graph showing the variation of the stress applied to the active layer of the semiconductor laser element of FIG. 1 when the AlAs mole fraction of the substrate and the cap layer, and the AlAs mole fraction of the cladding layer change, while the external force is not applied to the element.

The above-mentioned variation of the stress applied to the active layer 3 is not affected by the variation of the AlAs mole fraction (y) of the cladding layers 2 and 4. FIG. 8 shows the stress applied to the $Ga_{0.8}Al_{0.2}As$ active layer 3 when the AlAs mole fraction (z) of the substrate 1 and the cap layer 5, and the AlAs mole fraction (y) of the cladding layers 2 and 4 are changed.

Figure 9:
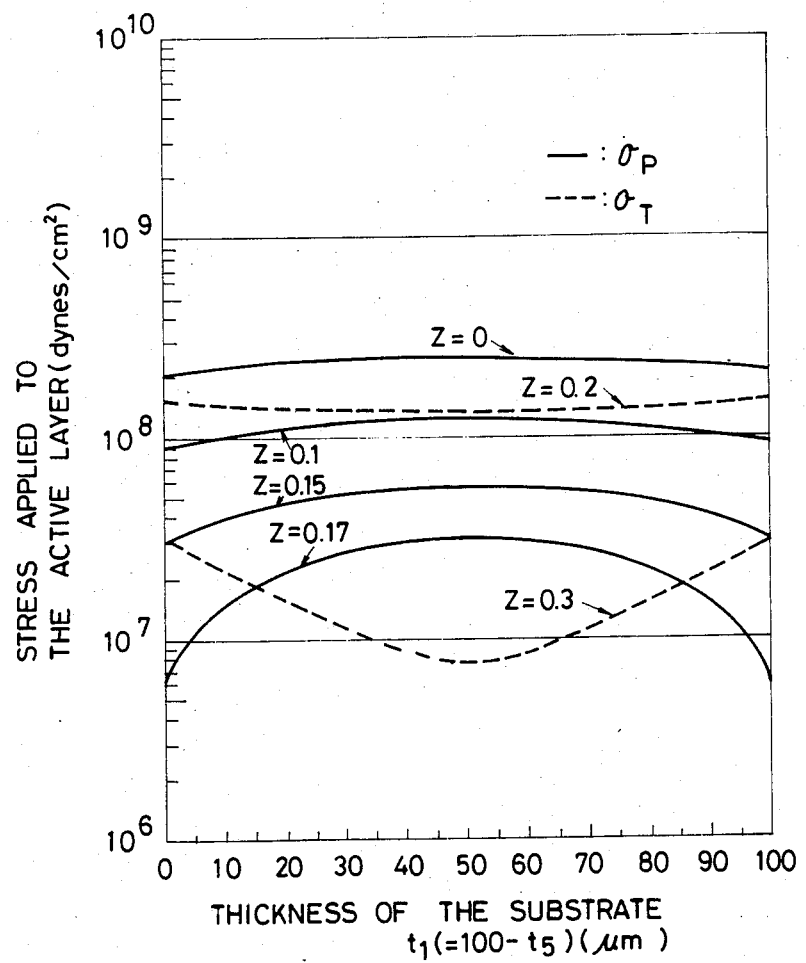
FIG. 9 is a graph showing the variation of the stress applied to the active layer when the thickness of the substrate ($t_1$) changes while the total thickness of the substrate and the cap layer is fixed to 100 μm and the external force is not applied to the element.

FIG. 9 shows the stress applied to the active layer 3 when the thickness of the substrate is changed while the total thickness of the substrate 1 and the cap layer 5 is fixed to 100 μm. FIG. 9 shows various cases when the AlAs mole fraction (z) of the substrate 1 and the cap layer 5 is changed, while the AlAs mole fraction (x) of the active layer 3 is fixed to 0.2 and the AlAs mole fraction (y) of the cladding layers 2 and 4 is fixed to 0.5.

It will be clear from the foregoing description that the affect caused by the external force is minimized when the active layer 3 is separated from the mounted surface by more than 35% of the thickness of the semiconductor laser element, and the active layer 3 is separated from the opposing surface by more than 18% of the thickness of the semiconductor laser element. Further, the compressive stress applied to the active layer 3 is minimized when the AlAs mole fraction (z) of the substrate 1 and the cap layer 5 is selected slightly smaller than the AlAs mole fraction (x) of the active layer 3.

EXAMPLE

FIGS. 10(A) through 10(D) show steps for manufacturing an embodiment of the semiconductor laser element of the present invention.

Figure 10:
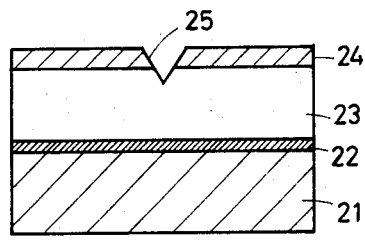
FIGS. 10(A) through 10(D) are sectional views for explaining manufacturing steps of an embodiment of a semiconductor laser of the present invention.
Figure 10:
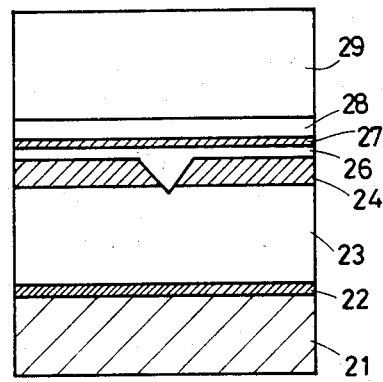
Figure 10:
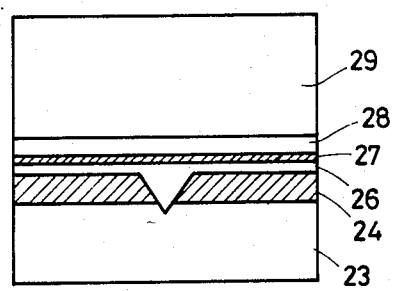
Figure 10:
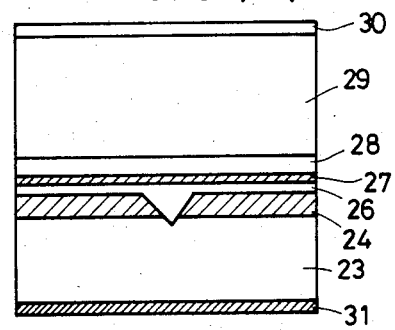

As shown in FIG. 10(A), on a GaAs substrate 21, a GaAlAs etching stop layer 22 (thickness 0.5 μm) having the AlAs mole fraction higher than 0.5, a p-$Ga_{0.8}Al_{0.2}As$ substrate 23 (thickness 60 μm), and an n-GaAs current blocking layer 24 (thickness 0.8 μm) are sequentially formed through the use of the liquid-phase growth method. Then, a V-shaped groove 25 is formed in the current blocking layer 24 through the use of the etching method. The V-shaped groove 25 reaches the p-$Ga_{0.8}Al_{0.2}As$ substrate 23 to define a current path so the a semiconductor laser having a V-shaped groove for current confinement is formed.

On the thus formed current blocking layer 24, as shown in FIG. 10(B), a p-$Ga_{0.5}Al_{0.5}As$ cladding layer 26 (thickness 0.15 μm at the flat portion), a p-$Ga_{0.8}Al_{0.2}As$ active layer 27 (thickness 0.1 μm), an n-$Ga_{0.5}Al_{0.5}As$ cladding layer 28 (thickness 1 μm), and n-$Ga_{0.8}Al_{0.2}As$ cap layer 29 (thickness 40 μm) are formed through the use of the sequential liquid-phase epitaxial growth method.

Thereafter, the GaAs substrate 21 is removed by a sulfuric acid system etchant. The etching operation is blocked by the etching stop layer 22 having a high AlAs mole fraction. Then, the etching stop layer 22 is removed by hydrogen fluoride (HF) so as to obtain a semiconductor laser wafer as shown in FIG. 10(C).

A p-electrode 31 is formed on the p-Ga$_{0.8}$Al$_{0.2}$As substrate layer 23, and an n-electrode 30 is formed on the n-Ga$_{0.8}$Al$_{0.2}$As cap layer 29 as shown in FIG. 10(D) through the use of the sputter method.

Each layer in the semiconductor laser element of the present invention is formed through the use of the annealing method associated with the liquid-phase epitaxial growth method. Accordingly, the AlAs mole fraction of the p-GaAlAs substrate layer 23 and the n-GaAlAs cap layer 29, which have the large thickness, reduces as the layer gradually grows.

Even though the AlAs mole fraction (z) of the substrate layer 23 and the cap layer 29 is set to 0.2, identical with the AlAs mole fraction of the active layer 27, at the initial stage of the growing process, the mean value of the AlAs mole fraction (z) of each layer becomes considerably less than the AlAs mole fraction (x) of the active layer 27 when the layers are formed to the desired thickness. Therefore, the compressive stress is applied to the active layer even when the external force is not applied to the semiconductor laser element.

Even when the AlAs mole fraction (z) of the p-GaAlAs substrate layer 23 and the n-GaAlAs cap layer 29 is set to a value relatively greater than the AlAs mole fraction (x) of the p-GaAlAs active layer 27 at the initial stage of the liquid-phase epitaxial growth process, the mean value of the AlAs mole fraction (z) of the p-GaAlAs substrate layer 23 and the n-GaAlAs cap layer 29 becomes less than the mole fraction (x) of the p-GaAlAs active layer 27 when the layers are completely formed. Thus, the tensile stress will not be applied to the active layer. However, if the AlAs mole fraction (z) is selected at a considerably higher value, it becomes difficult to form the ohmic contacts on the p-GaAlAs substrate layer 23 and the n-GaAlAs cap layer 29.

Figure 11:
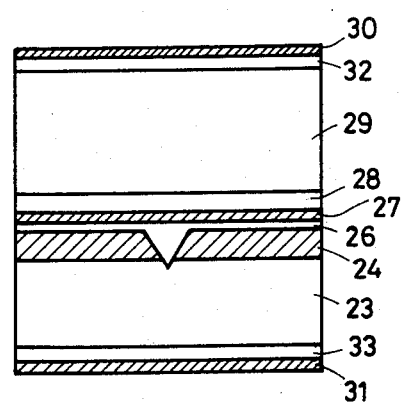
FIG. 11 is a sectional view of another embodiment of a semiconductor laser of the present invention.

FIG. 11 shows another embodiment of the semiconductor laser element of the present invention suited for ensuring the formation of the ohmic contact electrodes on the substrate layer 23 and the cap layer 29. A p-GaAs layer 33 (thickness 0.5 $\mu$m) is formed on the etching stop layer 22 (see FIG. 10(A)) and, then, the p-GaAlAs substrate layer 23 is formed on the p-GaAs layer 33. When the etching stop layer 22 is removed, the p-electrode 31 is easily formed on the p-GaAs layer 33. In a same manner, an n-GaAs layer 32 (thickness 0.5 $\mu$m) is formed on the n-GaAlAs cap layer 29 (see FIG. 10(B)). The n-electrode 30 is easily formed on the n-GaAs cap layer 29.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A GaAlAs semiconductor laser element having a predetermined thickness comprising:
   a Ga$_{1-z}$Al$_z$As substrate layer having a first surface and a second surface;
   a current blocking layer formed on said second surface Ga$_{1-z}$Al$_z$As substrate layer;
   A V-shaped groove formed in said current blocking layer;
   a first Ga$_{1-y}$Al$_y$As cladding layer formed on said current blocking layer;
   a Ga$_{1-x}$Al$_x$As active layer formed on said first GA$_{1-y}$Al$_y$As cladding layer;
   a second Ga$_{1-y}$Al$_y$As cladding layer formed on said Ga$_{1-x}$Al$_x$As active layer; and
   a Ga$_{1-w}$Al$_w$As cap layer having a bottom surface and a top surface, said bottom surface disposed on said second Ga$_{1-y}$Al$_y$As claddying layer, wherein the AlAs mole fraction z, x and w of said substrate layer, active layer and cap layer, respectively, satisfy the following relations: $0<v<1$, $0<y<1$, $0<z<x<1$, and $0<w<w<x<1$.

2. The GaAlAs semiconductor laser of claim 1, wherein said Ga$_{1-z}$Al$_z$As substrate layer has a thickness of about 60 $\mu$m, and said Ga$_{1-w}$Al$_w$As cap layer has a thickness of about 40 $\mu$m.

3. The GaAlAs semiconductor laser of claim 1, further comprising:
   a first GaAs layer formed on the surface of said Ga$_{1-w}$Al$_w$As cap layer;
   a first electrode disposed on a surface of said first GaAs layer, said first GaAs layer disposed between said surface of said Ga$_{1-w}$Al$_w$As cap layer and said first electrode;
   a second GaAs layer disposed on the surface of said Ga$_{1-z}$Al$_z$As substrate layer; and
   a second electrode disposed on a surface of said second GaAs layer, said first GaAs layer disposed between said surface of said Ga$_{1-z}$Al$_z$As substrate layer and said second electrode.

4. The GaAlAs semiconductor laser of claim 3, wherein the AlAs mole fraction z and w of the substrate layer and the cap layer respectively have the same value, and the AlAs mole fraction x of the active layer is 0.2.

5. The GaAlAs semiconductor laser of claim 3, wherein the AlAs mole fraction y of the cladding layer is 0.5.

6. The GaAlAs semiconductor laser of claim 4, wherein the AlAs mole fraction z of the substrate satisfies the equation: $0.1<z<0.2$.

7. The GaAlAs semiconductor laser of claim 1, wherein said active layer is separated from said first surface by more than 35% of the predetermined thickness and said active layer is separated from said top surface by more than 18% of the predetermined thickness.

* * * * *